US008847253B2

(12) United States Patent
Huang et al.

(10) Patent No.: US 8,847,253 B2
(45) Date of Patent: Sep. 30, 2014

(54) PROGRAMMING OPTICAL DEVICE

(75) Inventors: Chien-Chao Huang, Hsin-Chu (TW); Fu-Liang Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2413 days.

(21) Appl. No.: 12/036,063

(22) Filed: Feb. 22, 2008

(65) Prior Publication Data

US 2008/0142830 A1 Jun. 19, 2008

Related U.S. Application Data

(62) Division of application No. 11/190,992, filed on Jul. 27, 2005, now Pat. No. 7,361,541.

(51) Int. Cl.
*H01L 33/00* (2010.01)
*H05B 33/10* (2006.01)

(52) U.S. Cl.
CPC .................................... *H05B 33/10* (2013.01)
USPC ....... 257/98; 257/104; 257/E21.527; 438/199

(58) Field of Classification Search
USPC .................................... 257/103, 98; 438/199
See application file for complete search history.

(56) References Cited

U.S. PATENT DOCUMENTS

| | | | | |
|---|---|---|---|---|
| 5,585,640 | A | 12/1996 | Huston et al. | 250/483.1 |
| 6,225,647 | B1 * | 5/2001 | Kurtz et al. | 257/94 |
| 6,677,680 | B2 | 1/2004 | Gates et al. | 257/758 |
| 6,784,077 | B1 * | 8/2004 | Lin et al. | 438/426 |
| 2004/0155317 | A1 | 8/2004 | Bhattacharyya | 257/616 |
| 2004/0227140 | A1 * | 11/2004 | Lee et al. | 257/79 |
| 2007/0020840 | A1 * | 1/2007 | Chindalore | 438/211 |

FOREIGN PATENT DOCUMENTS

| | | |
|---|---|---|
| TW | 233703 | 6/2005 |
| TW | I233703 | 6/2005 |

OTHER PUBLICATIONS

Canham, L.T., "Silicon quantum wire array fabrication by electrochemical and chemical dissolution of wafers", Appl. Phys. Lett., vol. 57, No. 10 (Sep. 3, 1990) pp. 1046-1048.

Liu, C.W., et al., "Hot carrier recombination model of visible electroluminescence from metal-oxide-silicon tunneling diodes", Appl. Phys. Lett. vol. 77, No. 26 (Dec. 25, 2000) pp. 4347-4349.

Rebohle, L., et al., "Strong blue and violet photoluminescence and electroluminescence from germanium-implanted and silicon-implanted silicon-dioxide layers", Appl. Phys. Lett., vol. 71, No. 19 (Nov. 10, 1997) pp. 2809-2811.

Shcheglov, K.V. et al., "Electroluminescence and photoluminescence of Ge-implanted $Si/SiO_2/Si$ structures", Appl. Phys. Lett., vol. 66, No. 6 (Feb. 6, 1995) pp. 745-747.

Shimizu-Iwayama, Tsutomo, et al., "Visible photoluminescence in $Si^+$ implanted silica glass", J. Appl. Phys., vol. 75, No. 12 (Jun. 15, 1994) pp. 7779-7783.

* cited by examiner

*Primary Examiner* — Elias M Ullah
(74) *Attorney, Agent, or Firm* — Haynes and Boone, LLP

(57) ABSTRACT

A semiconductor light emitting device and a method to form the same are disclosed. The device has at least one porous or low density dielectric region formed in or on top of a bottom electrode, at least one top electrode on the porous or low density dielectric region, and one or more color filters placed above the top electrode, wherein the porous or low density dielectric region contains light emitting nanocrystal materials.

4 Claims, 5 Drawing Sheets

PROGRAMMING OPTICAL DEVICE

This application is a divisional application of U.S. patent application Ser. No, 11/190,992, filed Jul. 27, 2005, now U.S. Pat. No. 7,361,541, which is hereby incorporated by reference in its entirety.

BACKGROUND

The present invention relates generally to an integrated circuit (IC) design, and more particularly to light emitting technologies that can be produced in the same substrate along with a control circuit device.

Light emitting technology has been one of the fastest growing industries in recent years. The improvement in the technology has shrunk the size of many products such as computer displays by providing new generations of products such as the liquid crystal displays (LCD).

One conventional method for fabricating a light emitting device today is to implant a number of ultra-fine particles, which are also known as nanocrystals, into a thick dielectric layer above the silicon surface. These nanocrystals can be made of materials such as silicon (Si), germanium (Ge), or a combination of the two materials (SiGe). The dielectric layer is made of silicon-oxide ($SiO_2$), and it is a proven combination of materials that provides good control over the fabrication process.

However, this conventional method suffers from various critically important pitfalls. For example, it provides a poor gate dielectric layer interface, which reduces the ability to optimally form nanocrystals into the dielectric layer above the silicon surface. The CMOS device performance may also be poor due to poor hole mobility. The thick $SiO_2$ dielectric layer also means a higher material cost during fabrication. It is also difficult to combine the light emitting devices and control circuit devices on the same substrate with this conventional method. This is a major issue since the light emitting devices need to be assembled with many VLSI control circuit devices.

It is therefore desirable to design methods for a fabricating light emitting device that can be easily integrated with a control circuit without driving up fabrication cost.

SUMMARY

In view of the foregoing, this invention provides light emitting devices and methods for allowing the light emitting devices to be produced in the same substrate along with a control circuit device. In various embodiments of the present invention, methods for creating a light emitting device are shown. The device has at least one porous or low density dielectric region formed in or on top of a bottom electrode, at least one top electrode on the porous or low density dielectric region, and one or more color filters placed above the top electrode, wherein the porous or low density dielectric region contains light emitting nanocrystal materials. As the device is generated using a CMOS process, they can be manufactured along with the control circuit.

The construction and method of operation of the invention, however, together with additional objectives and advantages thereof will be best understood from the following description of specific embodiments when read in connection with the accompanying drawings.

DESCRIPTION

The present disclosure provides several methods for fabricating light emitting devices such that the light emitting device is produced in the same substrate along with the control circuit device.

Figure 1:
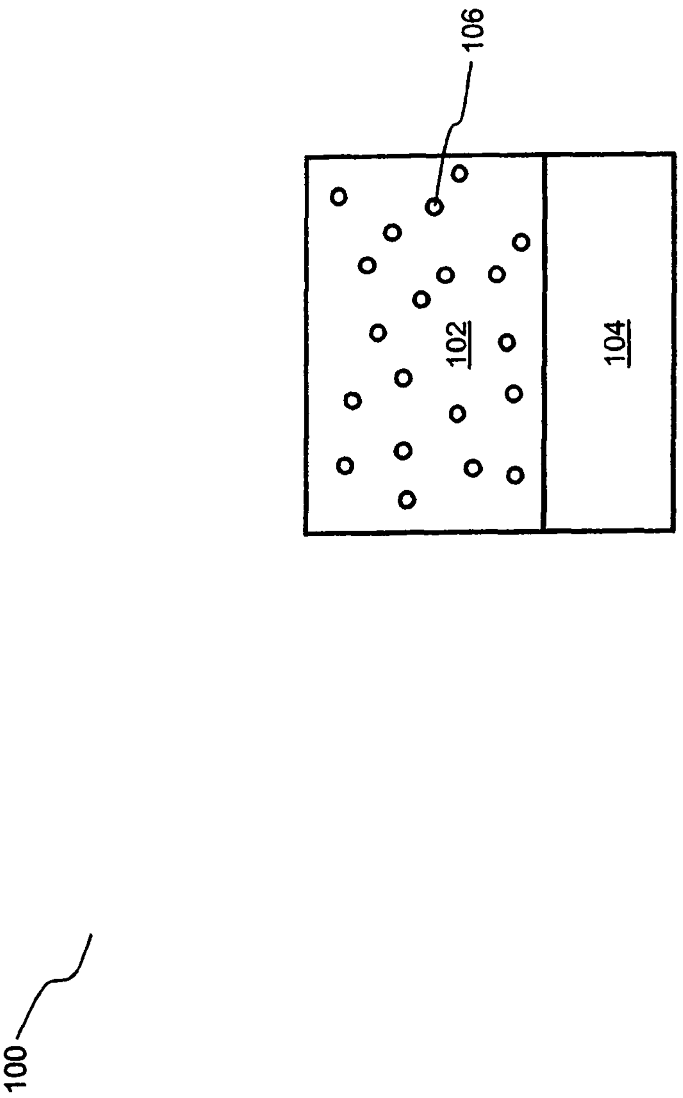
FIG. 1 (PRIOR ART)
FIG. 1 illustrates a conventional semiconductor cross-section of a light emitting device.

FIG. 1 illustrates a conventional semiconductor cross-section 100 of a light emitting device with nanocrystals implanted into a thick dielectric layer (e.g., comprised of silicon-oxide) that is formed above the silicon substrate. A thick dielectric layer 102 is formed above a silicon substrate 104. The thickness of the dielectric layer 102 can affect the color generated by the light emitting device. The dielectric layer 102 is typically made of silicon-oxide ($SiO_2$), which provides good control over the fabrication process. A number of nanocrystals 106, which are ultra-fine particles, are implanted into the thick dielectric layer 102 above the surface of the silicon substrate 104 as a light emitting medium. These nanocrystals 106 can be made of materials such as silicon (Si), germanium (Ge), or a combination thereof.

However, this conventional design presents several issues. For example, a relatively poor gate dielectric layer interface prevents an optimum formation of the nanocrystals. The CMOS device performance may also be poor due to poor hole mobility. A high material cost is inevitable due to the thick dielectric layer 102.

Figure 2A:
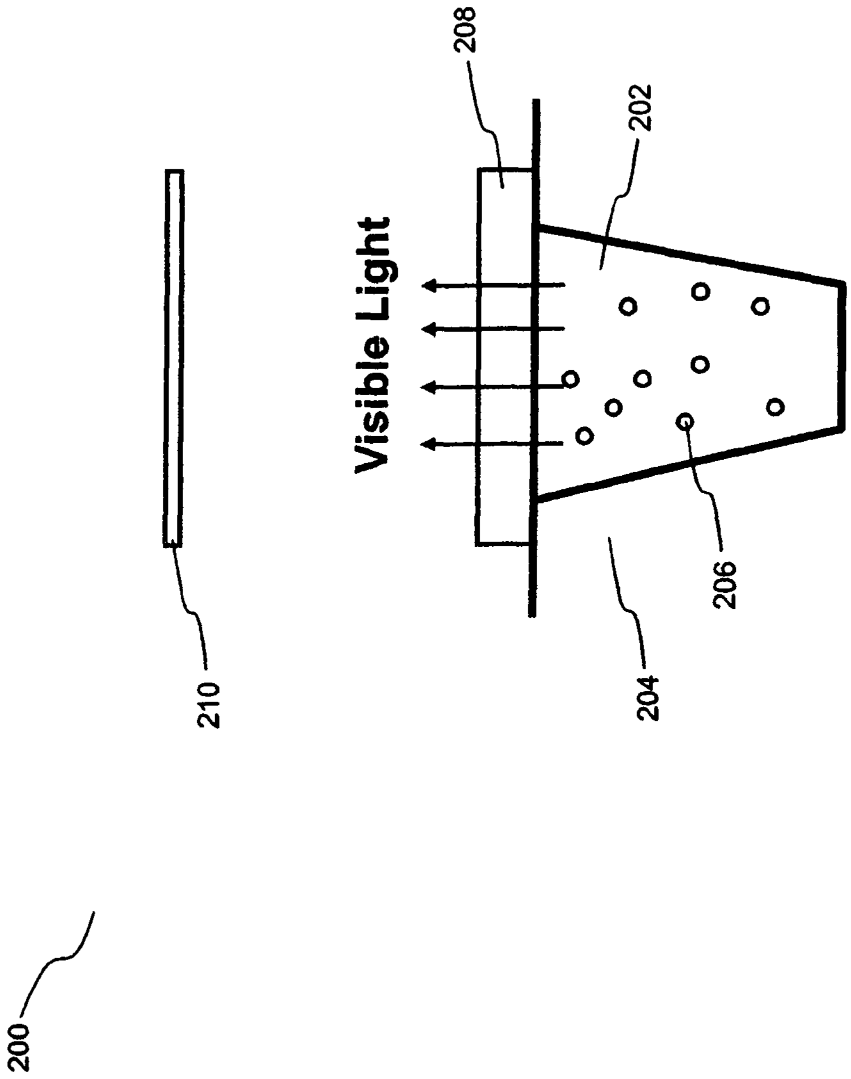
FIG. 2A illustrates a semiconductor cross-section of a light emitting device with nanocrystals implanted into a dielectric layer comprised of porous or low density oxide in accordance to one embodiment of the present invention.

FIG. 2A illustrates a cross-section 200 of a light emitting device with nanocrystals implanted into a dielectric layer comprising porous or low density oxide in accordance to one embodiment of the present invention. In this embodiment, the porous or low density oxide is formed within a shallow trench isolation created within the silicon substrate.

In the cross-section 200, a shallow trench isolation (STI) 202 is created within a silicon substrate 204. The STI 202, used as a dielectric layer, is filled with a type of porous or low density oxide. This porous or low density oxide is preferably a low-K material; sub-atmospheric chemical vapor deposition (SACVD) oxide or plasma enhanced chemical vapor deposition (PECVD) oxide, and increases its formation efficiency by having a plurality of nanocrystals 206. The porous size of porous materials is at least larger than 2 nm. The low density oxide has a wet etching rate greater than 200A/min in 50:1 HF solution. As an example, the porous or low density oxide can be placed through an SACVD or PECVD. The porous or low density oxide can help improve the hole mobility and gate dielectric layer interface. The nanocrystals 206 are implanted into the porous or low density oxide within the STI 202 as a light emitting medium, and the implantation methods are well-known by those skilled in the art. Note that the nanocrystals 206 can be made of Si, Ge, or a combination thereof. In order for the nanocrystals 206 to emit light, a top electrode 208 is implemented above the STI 202 while the silicon substrate 204 is used as a bottom electrode. The STI 202 can have a thickness of more than 3000 Å.

In this design, light emitted from the nanocrystals 206 can be visible above the top electrode 208. An optional color filter film 210 can also be implemented on a higher level above the top electrode 208 to provide the color desired. The thickness of the dielectric layer can also affect the color generated. Also note that the processing steps and materials used for creating the components of this design such as the STI 202 and the top electrode 208 are all compatible with the current standard CMOS process. This allows further circuit integration for this design such as implementation of VLSI memory.

Figure 2B:
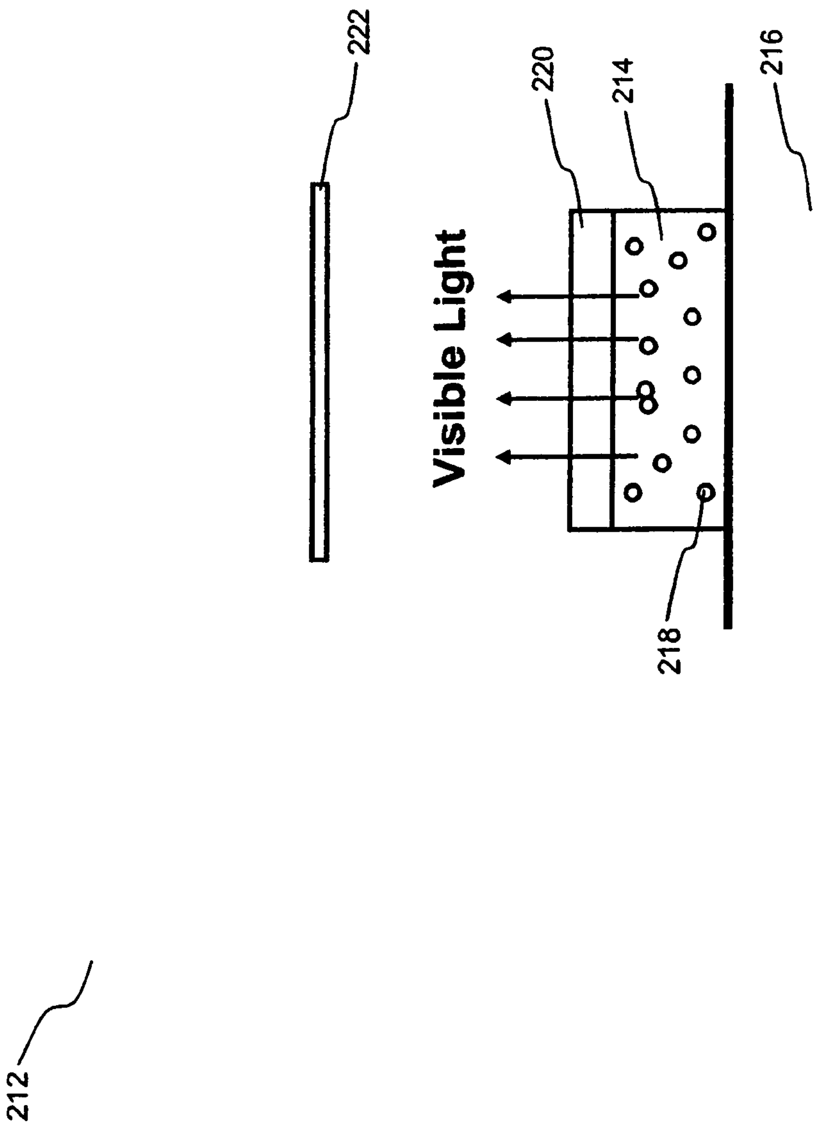
FIG. 2B illustrates a semiconductor cross-section of a light emitting device with nanocrystals implanted into a dielectric layer comprised of porous or low density oxide in accordance to another embodiment of the present invention.

FIG. 2B illustrates a semiconductor cross-section 212 of a light emitting device with nanocrystals implanted into a dielectric layer comprising porous or low density particles in accordance to another embodiment of the present invention. In this embodiment, the dielectric layer comprises a porous or low density oxide that is formed above the silicon substrate. A dielectric layer 214 has the same porous or low density oxide used in FIG. 2A which is formed above a silicon substrate 216. The thickness of which can be larger than 3000 Å. A plurality of nanocrystals 218 are implanted into the dielectric layer 214 above the surface of the silicon substrate 216 as a light emitting medium. These nanocrystals 218 can be made of materials such as silicon (Si), germanium (Ge), or a combination thereof.

Like in FIG. 2A, the porous or low density oxide used for the dielectric layer 214 is a low-K material, which can increase the formation efficiency of the nanocrystals 218. In order for the nanocrystals 218 to emit light, a top electrode 220 is implemented above the dielectric layer 214 while the silicon substrate 216 is used as a bottom electrode.

In this design, light emitted from the nanocrystals 218 can be visible above the top electrode 220. An optional color filter film 222 can also be implemented on a higher level above the top electrode 220 to provide the color desired. The thickness of the dielectric layer 214 can also affect the color generated. Also note that the processing steps and materials used for creating the components of this design such as the dielectric layer 214 and the top electrode 220 are all compatible with the current standard CMOS process. This allows further circuit integration for this design such as implementation of VLSI memory.

Figure 2C:
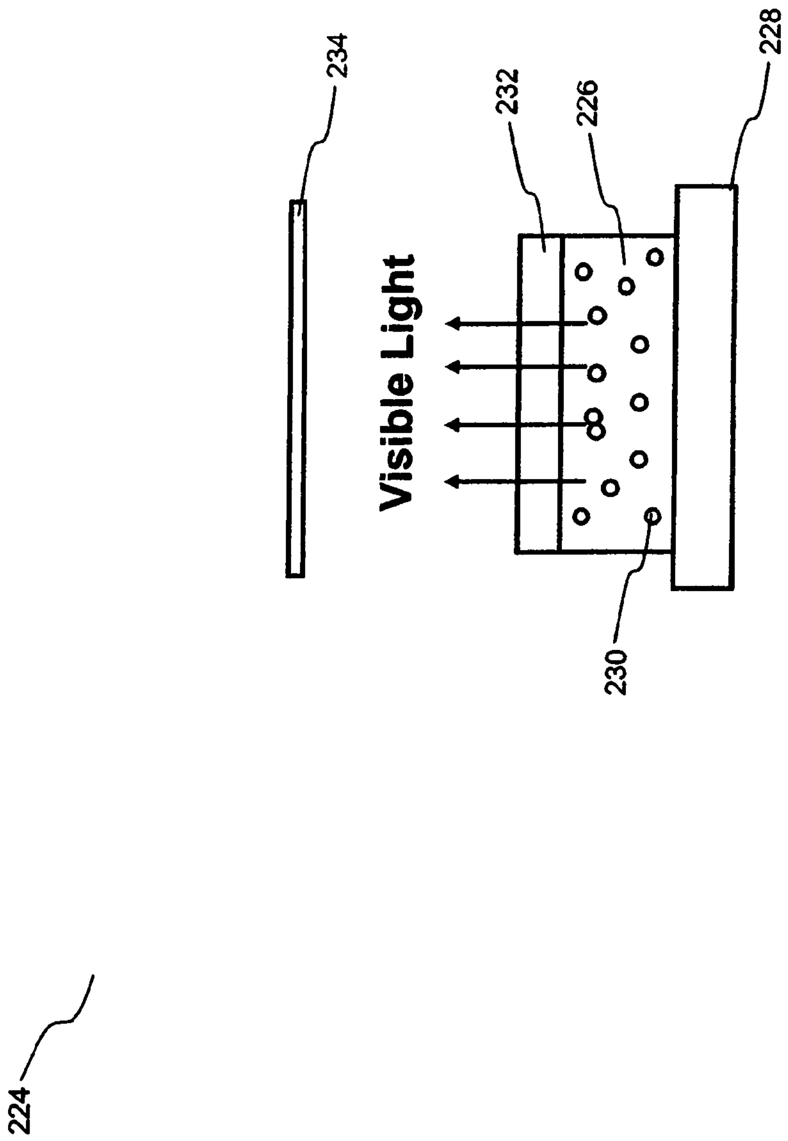
FIG. 2C illustrates a semiconductor cross-section of a light emitting device with nanocrystals implanted into a dielectric layer comprised of porous or low density oxide in accordance to another embodiment of the present invention.

FIG. 2C illustrates a semiconductor cross-section 224 of a light emitting device with nanocrystals implanted into a dielectric layer comprising porous or low density oxide in accordance to another embodiment of the present invention. In this embodiment, the dielectric layer comprises a porous or low density oxide above a metal layer that acts as a bottom electrode.

The cross-section 224 is similar to the cross-section 212 of FIG. 2B. A dielectric layer 226 is filled with the same porous or low density oxide used in the FIG. 2A and FIG. 2B. However, in this example, the dielectric layer 226 is formed on a metal layer 228 instead of the silicon substrate. The metal layer 228 is also designed to be the bottom electrode. A plurality of nanocrystals 230 are also implanted into the dielectric layer 226 as a light emitting medium. These nanocrystals 230 can be made of materials such as silicon (Si), germanium (Ge), or a combination thereof.

The porous or low density oxide used for the dielectric layer 226 is a low-K material, which can increase the formation efficiency of the nanocrystals 230. In order for the nanocrystals 230 to emit light, a top electrode 232 is also implemented on the dielectric layer 226 while the metal layer 228 is used as the bottom electrode.

In this design, light emitted from the nanocrystals 230 can be visible above the top electrode 232. An optional color filter film 234 can also be implemented on a higher level above the top electrode 232 to provide the color desired. The thickness of the dielectric layer 226 can also affect the color generated. Also note that the processing steps and materials used for creating the components of this design such as the dielectric layer 226, the metal layer 228, and the top electrode 232 are all compatible with the current standard CMOS process. This allows further circuit integration for this design such as implementation of VLSI memory.

Figure 3:
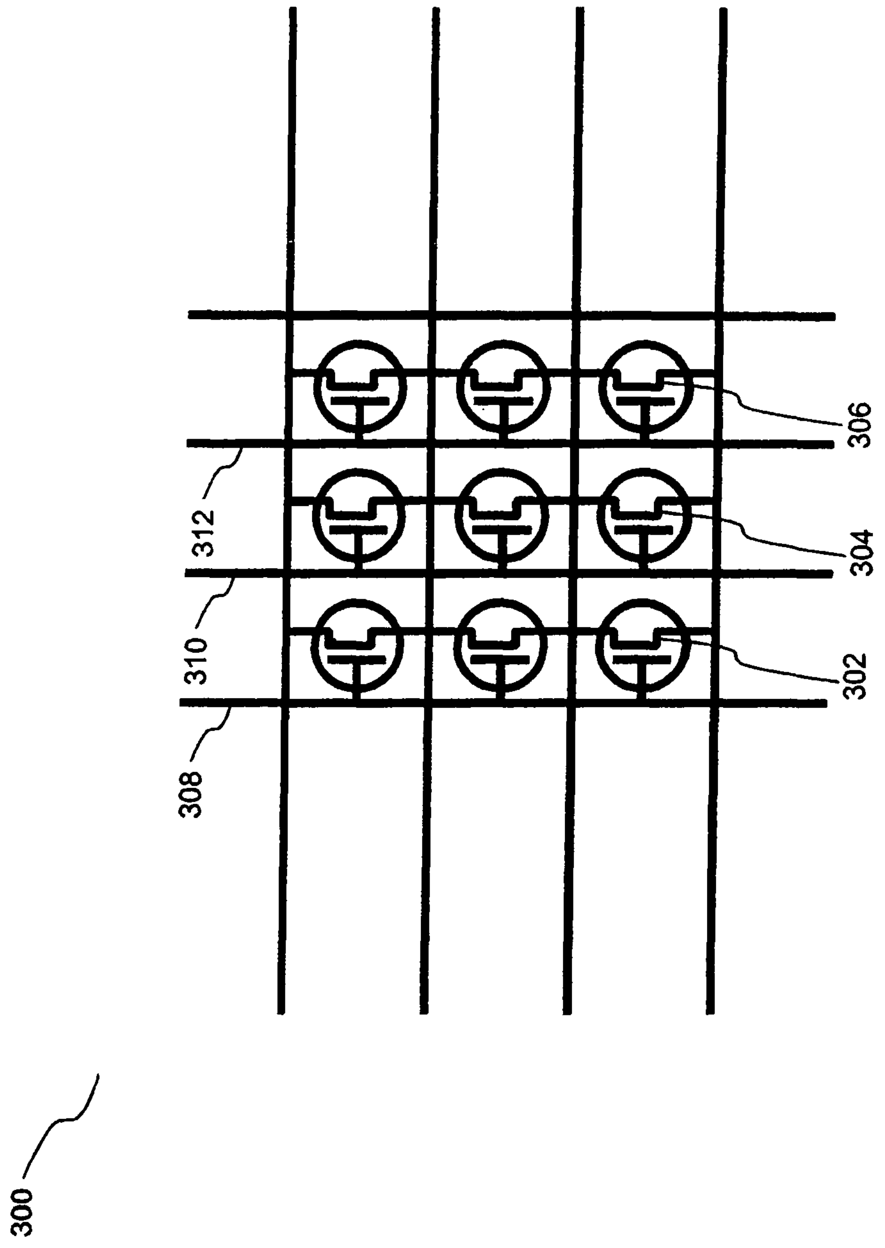
FIG. 3 illustrates a three-pixel circuit in accordance to various embodiments of the present invention.

FIG. 3 illustrates a three-pixel circuit 300 in accordance to various embodiments of the present invention. The circuit 300, which is fabricated with standard CMOS processes, can be integrated with the cross-sectional designs shown in FIGS. 2A, 2B, and 2C, since they are designed to be compatible with current standard CMOS processes.

Each pixel comprises three NMOS transistors that are lined up in the same row. Each of the three NMOS transistors is designed to control a certain color of the pixel: red, green, or blue. For example, a pixel comprised of three NMOS transistors 302, 304, and 306 is used to display an RGB color, with the transistor controlling red output, the transistor 304 controlling green output, and the transistor 306 controlling blue output. The color output corresponding to a transistor can be determined by a color filter that is placed above the light emitting device corresponding to that transistor. Since there are three columns and three rows of transistors in the circuit diagram 300, a total of three pixels are shown.

The gates of all NMOS transistors are tied to a corresponding variable voltage generator circuit, which is not shown in this figure, through a signal line. By adjusting the voltage applied to the gate of the NMOS transistors, the intensity of the light emitted for the certain color can be controlled. For example, the gate of the NMOS transistor 302 is coupled to a variable voltage generator circuit that controls the intensity of the color red through a signal line 308. The gate of the NMOS transistor 304 is coupled to a variable voltage generator circuit that controls the intensity of the color green through a signal line 310, and the gate of the NMOS transistor 306 is coupled to a variable voltage generator circuit that controls the intensity of the color blue through another signal line 312. With this pixel concept, different color light can be generated and adjusted with three optical devices.

By using plasma doping methods or other implantation methods to implant nanocrystals made of silicon (Si), germanium (Ge), or a combination thereof into a more porous or low density dielectric layer with a lower dielectric constant (such as the SACVD oxide or porous or low density low-K materials), the formation efficiency of the nanocrystals can be increased, thereby improving the hole mobility and gate dielectric layer interface of the light emitting device. In addition, the control electrode on top of the porous or low density dielectric layer such as layers 208, 220, and 232 can be formed by non-poly semiconductor materials such as Indium Tin oxide as long as such materials can handle the voltage applied thereon. The proposed method also allows the light emitting device to be created within the same substrate with the VLSI circuit, because all process steps and materials are compatible with the current CMOS fabrication process.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor light emitting device comprising:

a metal layer formed on top a semiconductor substrate, the metal layer serving as a bottom electrode for the semiconductor light emitting device;

a low density dielectric region deposited on the metal layer, the low density dielectric region containing light emitting nanocrystal materials;

at least one top electrode of the semiconductor light emitting device formed on the low density dielectric region.

2. The device of claim 1, wherein the nanocrystal materials contain either Si or Ge based material.

3. The device of claim 1, wherein the low density dielectric region contains a material selected from the group consisting of a low-k dielectric material and an oxide.

4. The device of claim 1 further comprising one or more color filters placed above the top electrode.

* * * * *